United States Patent
Darbinyan et al.

(10) Patent No.: US 11,527,298 B1
(45) Date of Patent: Dec. 13, 2022

(54) ON-CHIP MEMORY DIAGNOSTICS

(71) Applicant: Synopsys, Inc., Mountain View, CA (US)

(72) Inventors: Karen Darbinyan, Mountain View, CA (US); Tatevik Melkumyan, Yerevan (AM); Yervant Zorian, Mountain View, CA (US)

(73) Assignee: Synopsys, Inc., Mountain View, CA (US)

(*) Notice: Subject to any disclaimer, the term of this patent is extended or adjusted under 35 U.S.C. 154(b) by 0 days.

(21) Appl. No.: 17/162,347

(22) Filed: Jan. 29, 2021

Related U.S. Application Data

(60) Provisional application No. 62/968,069, filed on Jan. 30, 2020.

(51) Int. Cl.
*G11C 29/38* (2006.01)
*G06F 16/215* (2019.01)
*G06F 13/28* (2006.01)

(52) U.S. Cl.
CPC .............. *G11C 29/38* (2013.01); *G06F 13/28* (2013.01); *G06F 16/215* (2019.01)

(58) Field of Classification Search
CPC ........ G11C 29/38; G06F 16/215; G06F 13/28
See application file for complete search history.

(56) References Cited

U.S. PATENT DOCUMENTS

| 11,081,202 B2 * | 8/2021 | Srinivasan | G11C 29/44 |
| 2016/0284426 A1 * | 9/2016 | Busi | G11C 29/12 |
| 2016/0365156 A1 * | 12/2016 | Busi | G11C 29/18 |
| 2020/0321070 A1 * | 10/2020 | Hanagandi | G11C 29/42 |
| 2021/0065836 A1 * | 3/2021 | Ahn | G11C 29/12015 |

* cited by examiner

*Primary Examiner* — Kyle Vallecillo
(74) *Attorney, Agent, or Firm* — Park, Vaughan, Fleming & Dowler LLP; Laxman Sahasrabuddhe

(57) ABSTRACT

An on-chip memory diagnostic (OCMD) circuit may instruct a set of built-in self-test (BIST) engines to execute BIST on memories associated with the set of BIST engines. Next, results of executing BIST on the memories may be received from the set of BIST engines. A set of memory failures may then be identified in the memories based on the results. Next, one or more BIST engines in the set of BIST engines may be instructed to collect diagnostic data for each memory failure. A set of diagnostic data may then be received for the set of memory failures. Next, the set of diagnostic data may be stored in an on-chip data container. The set of diagnostic data may then be provided via a communication channel.

20 Claims, 4 Drawing Sheets

US 11,527,298 B1

ON-CHIP MEMORY DIAGNOSTICS

RELATED APPLICATION

This application claims the benefit of U.S. Provisional Application Ser. No. 62/968,069, filed on 30 Jan. 2020, the contents of which are herein incorporated by reference in their entirety for all purposes.

TECHNICAL FIELD

The present disclosure relates to integrated circuit (IC) design, manufacturing, and testing. More specifically, the present disclosure relates to on-chip memory diagnostics (OCMD).

BACKGROUND

The importance of testing cannot be overemphasized. It would be risky to use large and complex IC designs in critical applications without rigorous testing. Memory blocks are an important part of an IC design. In this disclosure, the terms "memory block," "memory device," and "memory" generally refer to circuitry (e.g., dynamic random-access memory (DRAM) circuitry) that stores data (typically large amounts of data) in an IC design. A faulty memory cell can cause the entire IC chip to fail. Thus, testing memory blocks within an IC chip is important.

A built-in self-test (BIST) can test a memory in an IC chip. The BIST may generally be run at any desired time, including, but not limited to, periodically, upon power-up, or in response to the occurrence of an internal or external condition. The term "march element" may refer to a sequence of operations that are performed on each memory address of a set of memory addresses in a specific order. For example, a march element may correspond to performing the sequence of operations "write 0, write 1, read an expected 1" on each memory address of a set of memory addresses in a specific order including, but not limited to, an increasing order or a decreasing order. A march test may include a set of march elements, and a BIST may include one or more march tests.

SUMMARY

Some embodiments described herein may feature an OCMD circuit that instructs a set of BIST engines to execute BIST on memories associated with the set of BIST engines. Next, the OCMD circuit may receive results of executing BIST on the memories from the set of BIST engines. The OCMD circuit may then identify a set of memory failures in the memories based on the results. Next, the OCMD may instruct one or more BIST engines in the set of BIST engines to collect diagnostic data for each memory failure in the memories. The OCMD may then receive a set of diagnostic data for the set of memory failures. Next, the OCMD may store the set of diagnostic data in an on-chip data container. The OCMD may then provide the set of diagnostic data via a communication channel.

In some embodiments, the OCMD may de-duplicate and/or compress the set of diagnostic data. In some embodiments, the OCMD may truncate each diagnostic data in the set of diagnostic data in response to determining that the diagnostic data exceeds a size limit. In some embodiments, the OCMD may identify up to an upper limit of memory failures.

In some embodiments, the communication channel is a direct memory access (DMA) interface. Specifically, in some embodiments, a tester coupled to the OCMD via the DMA interface may retrieve data stored in the on-chip data container in response to the OCMD asserting a data ready signal or a done signal.

In some embodiments, the OCMD may collect diagnostic data during a high temperature operating life (HTOL) test that is performed during volume manufacturing.

BRIEF DESCRIPTION OF THE FIGURES

The disclosure may be understood based on the detailed description given below and the accompanying figures. The figures are for illustrative purposes, and do not limit the scope of the disclosure. Furthermore, the figures are not necessarily drawn to scale.

DETAILED DESCRIPTION

Figure 1:
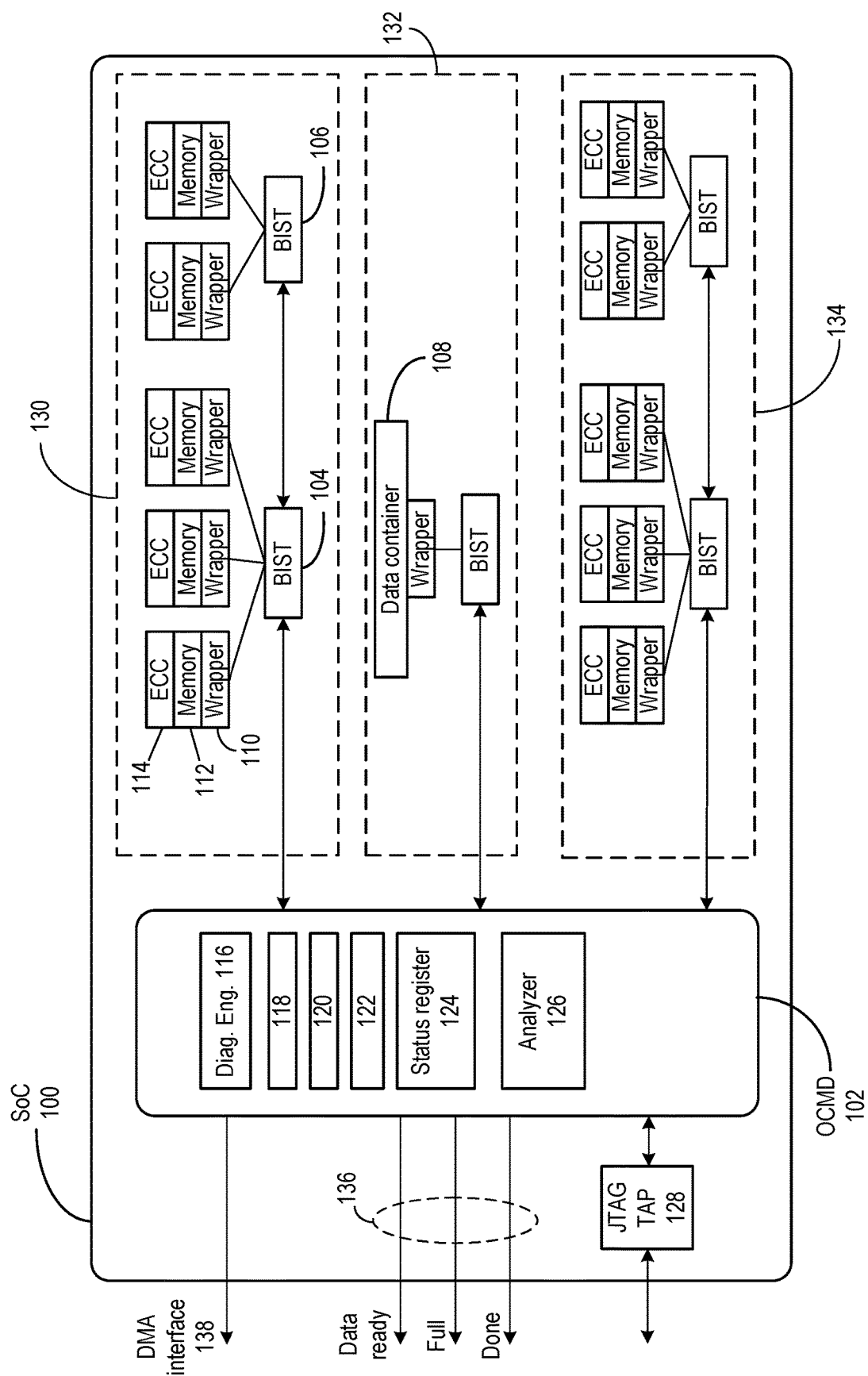
FIG. 1 illustrates an OCMD in accordance with some embodiments described herein.

Aspects of the present disclosure relate to memory diagnostics. Memory diagnosis may refer to a process that can determine the physical location of memory failures. During IC design, sample IC chips may be manufactured and tested. The IC design may include a BIST engine that can execute a BIST on memories embedded in the IC design. Automatic test equipment (ATE) or a tester may communicate with a BIST engine in an IC design via a serial Joint Test Action Group (JTAG) interface. The ATE may use the BIST engine to test memories and collect diagnostic data. The diagnostic data may be communicated from the BIST engine to the ATE by using the serial JTAG interface for further analysis. In existing techniques, the ATE stops the BIST execution when a memory failure is detected, instructs the BIST engine to collect diagnostic data, and receives diagnostic data via the serial JTAG interface. Thus, in existing techniques, ATE intervenes and collects diagnostic data for each memory failure.

Once an IC design has been finalized, the IC design may be provided to a semiconductor manufacturer (i.e., foundry) for volume manufacturing. It is desirable to perform memory testing and diagnostics during volume manufacturing. During volume manufacturing, IC dies may be tested to sort out the dies on the wafer into two sets: prime dies that have no defects, and defective dies that have defects. The defects identified during testing may have been caused by the manufacturing process, a problem in the IC design, or due to the environmental conditions during test (e.g., temperature and voltage variations). The semiconductor manufacturer may not only desire to collect the pass/fail (also known as go/no-go) status of the memory devices in the die but also desire to collect diagnostic data that can be used to identify the defect locations, and/or conditions and failing mechanisms for the defects. Embedded memories (e.g., memory blocks in a system-on-a-chip (SoC) design) often are the densest portions of the IC design, and therefore may be more susceptible to defects. Hence, it is important to collect diagnostic information during volume manufacturing on memory failures to enable defect and yield analysis to be performed so that the semiconductor manufacturer can reduce the defect count per die per wafer.

Existing techniques (e.g., an ATE communicating with the BIST via JTAG) for performing memory testing and diagnostics are not performed during volume manufacturing because such techniques take a long time and use a large amount of test and diagnostic resources. Specifically, the amount of diagnostic information collected can be large because the diagnostic information may (1) be collected for each failed memory operation, (2) include the actual logical and physical address of the failure is collected, (3) include information of the BIST operation that caused the failure is collected, and (4) include the expected results. Additionally, interactions with the ATE may be constrained by the clock frequency at which information is communicated through JTAG, which typically is between 5-50 MHz. Moreover, communicating with the ATE may impose restrictions on the pin count, and the ATE pattern memory depth may also be limited. For these reasons, memory diagnostics are not run during volume manufacturing because existing techniques take a long time, are expensive, and use a large amount of resources.

Some embodiments described herein include an OCMD engine that is part of the IC chip (e.g., the OCMD may be a module in an SoC design) to collect diagnostic data during volume manufacturing, which can significantly reduce the amount of time used for testing and diagnosing memory failures during volume manufacturing. In some embodiments, the OCMD engine may operates in two phases. First, the OCMD engine may identify memory defects. Second, the OCMD engine may autonomously begin test diagnostics on the memories that reported defects, collect the diagnostic data, and store the diagnostic data in one or more on-chip data containers. The OCMD engine eliminates the ATE interactions that occur in existing techniques for each memory failure. Embodiments described herein may upload diagnostic data to the ATE after the OCMD engine completes the diagnostic process, or when a data container that stores diagnostic data is full.

Advantages of embodiments described herein include, but are not limited to, (1) significantly reducing the amount of test and diagnostic time used during volume manufacturing, (2) significantly reducing the amount of time ATE is used, (3) simplifying the ATE test process (because the diagnostic data collection process is now performed by the OCMD engine), (4) reducing IC chip manufacturing costs, (5) reducing defect count goals (because the IC design and/or semiconductor manufacturing process may be modified based on the diagnostic data), (6) reducing the ATE pattern count because the OCMD can combine the pass/fail test patterns with the diagnostic pattern, and (7) eliminating the need for specialized ATE to perform tests during volume manufacturing (e.g., traditional techniques may need specialized ATE during an HTOL test, i.e., during a chip baking test in the chamber; on the other hand, OCMD based embodiments described herein can run full diagnostics during an HTOL test without requiring specialized ATE).

FIG. 1 illustrates an OCMD in accordance with some embodiments described herein.

An IC design, e.g., SoC 100, may include multiple circuit blocks, e.g., circuit blocks 130, 132, and 134. Each circuit block may include multiple memories, e.g., memory 112. SoC 100 may also include a set of BIST engines, e.g., BIST engines 104 and 106. A set of memories may be grouped under a BIST engine, e.g., three memories (including memory 112) are grouped under BIST engine 104. A memory may include error-correcting circuitry (ECC), e.g., ECC 114. Some of the logic for performing march tests on memories may be implemented by a wrapper module, e.g., wrapper 110. Thus, the BIST functionality may be implemented by a combination of a BIST engine (e.g., BIST 104) and a wrapper module (e.g., wrapper 110). The BIST engines may be controlled by OCMD engine 102 to run test and diagnostics on the memories and store the diagnostics data into data container 108. Data container 108 may be implemented using a memory and may itself be grouped under a BIST.

OCMD 102 may be coupled with the ATE using signals 136, which may include, but are not limited to, a data ready signal, a full signal, and a done signal. The data ready signal may indicate to the ATE that diagnostic data is ready to be collected from data container 108, the full signal may indicate to the ATE that data container 108 is full, and the done signal may indicate to the ATE that the diagnostic process has been completed (e.g., the diagnostic process may complete after diagnostic data has been collected for all memory failures). The ATE may then retrieve the diagnostic data stored in data container 108 through DMA interface 138.

In some embodiments, OCMD 102 may include one or more engines or modules including, but not limited to, diagnostic engine 116 and analyzer 126. Diagnostic engine 116 may implement the diagnostic data collection process. Analyzer 126 may receive diagnostic data from the BIST engines (e.g., BIST engine 104), and store the diagnostic data in data container 108 after optionally performing de-duplication and/or compression.

Diagnostic engine 116 may instruct each BIST engine (e.g., BISTs 104, 106, etc.) in SoC 100 to execute a BIST on each memory that is associated with the BIST engine. Once a BIST engine (e.g., BIST engine 104) receives the begin execution instruction from diagnostic engine 116, the BIST engine may begin a BIST run on the memories that are coupled to the BIST engine. For example, upon receiving the begin execution instruction, BIST engine 104 may begin a BIST run on memory 112 with the help of wrapper 110.

Once a BIST engine (e.g., BIST engine 104) completes execution of the BIST on each memory associated with the BIST engine, the BIST engine may provide the pass/fail (also known as go/no-go) results to diagnostic engine 116. Next, diagnostic engine 116 may instruct the BIST engines that reported memory failures to collect diagnostic data corresponding to the memory failures. Next, the BIST engine may execute the BIST on a memory that reported a failure and stop the BIST upon reaching the memory failure. The BIST engine may then collect diagnostic data and provide the diagnostic data to analyzer 126 and continue executing the BIST on the memory until the next memory failure is reached. In this manner, OCMD 102 can use diagnostic engine 116 and analyzer 126 to collect diagnostic data for all memory failures in the embedded memories of SoC 100 without any intervention from an ATE.

In some embodiments, analyzer 126 may store the diagnostic data as is in data container 108. In some embodiments, analyzer 126 may de-deduplicate and/or compress the diagnostic data and store the de-deduplicated and/or compressed version of the diagnostic data in data container 108. As one example, analyzer 126 may check if the diagnostic data corresponds to a memory failure that has been seen previously, and whose diagnostic data has already been stored in data container 108. If so, analyzer 126 may ignore the diagnostic data. On the other hand, if the diagnostic data corresponds to a memory failure that has not been seen yet, then analyzer 126 may store the diagnostic data (after optionally performing de-duplication and/or compression) in data container 108.

In some embodiments, OCMD 102 may include a set of registers including, but not limited to, a record size register 118, a failure count register 120, a BIST engine identifier register 122, and status register 124. Record size register 118 may store a maximum size of diagnostic data that is desired to be stored per memory failure. When analyzer 126 receives diagnostic data from a BIST engine (e.g., BIST engine 104), analyzer 126 may truncate the diagnostic data if the amount of diagnostic data exceeds the record size specified in record size register 118. Failure count register 120 may store the total number of memory failures for which diagnostic data is desired to be collected. Thus, if failure count register 120 contains the value 100, then diagnosis engine 116 may collect diagnostic data for the first 100 memory failures that are encountered.

BIST engine identifier register 122 may be used to specifically target a BIST engine or a subset of BIST engines for diagnostic data collection. Specifically, if BIST identifier register 122 contains a set of BIST engine identifiers, then diagnostic engine 116 may instruct only the BIST engines corresponding to the set of BIST engine identifiers to collect diagnostic data. Status register 124 may store the status of OCMD 102. Specifically, signals 136 may be generated based on status register 124.

In some embodiments, OCMD 102 may provide flexible data collection. Specifically, the amount of diagnostic data that is collected may be configurable, and OCMD 102 may collect the desired amount of diagnostic data. In some embodiments, record size register 118 and failure count register 120 may be used to implement flexible data collection, i.e., these two registers may be used to control the amount of diagnostic data that is collected. For example, a user may specify that diagnostic data for the first 1000 memory failures is desired to be collected, and the total amount of data should not exceed 1 GB. Accordingly, record size register 118 may be set to 1024 (which corresponds to 1 MB) and failure count register 120 may be set to 1000. With these register values, OCMD 102 may collect diagnostic data for the first 1000 memory failures (and up to 1 MB diagnostic data per memory failure).

The logic that performs BIST (e.g., BIST 104 and wrapper 110) is typically stateful, i.e., BIST 104 and wrapper 110 may have a state at any given point during operation. For example, circuitry that performs BIST may include one or more state machines. When a memory failure is detected, the current state of the BIST execution (e.g., the current state of BIST 104 and/or wrapper 110) may be collected as part of diagnostic data collection. The state of the BIST execution may be stored in one or more registers (which may be located inside or outside BIST 104 and/or wrapper 110), and the values of these registers may be collected during diagnostic data collection.

The diagnostic data corresponding to a memory failure may be referred to as the error signature of the memory failure. The diagnostic data may include, but is not limited to, the current bank address, the current memory address, the current column address, the current row address, the current march element that is being executed. The diagnostic data may be subsequently analyzed by an apparatus (e.g., a computer system executing an analysis application) to determine the physical location of the memory failure based on the diagnostic data collected by OCMD 102.

Embodiments described herein can significantly reduce the amount of time required to run memory diagnostic data collection. For example, to diagnose n memory failures, the following equation may represent the amount of time used by traditional techniques to collect diagnostic data (in traditional techniques, an interaction between the ATE and the BIST occurs via the serial JTAG interface for each memory failure):

$$T_{TRADITIONAL} = n \times BIST\_RUN\_TIME + n \times DIAG\_SHIFT\_TIME + n \times INTERACTION\_WITH\_TESTER,$$

where "BIST_RUN_TIME" is the amount of time for which a BIST run executes, "DIAG_SHIFT_TIME" is the amount of time it takes to collect diagnostic data per memory failure, and "INTERACTION_WITH_TESTER" is the amount of time used for interacting with a tester per memory failure.

The following equation may represent the amount of time used to collect diagnostic data using embodiments described herein:

$$T_{OCMD} = n \times BIST\_RUN\_TIME/2 + n \times DIAG\_SHIFT\_TIME + 1 \times INTERACTION\_WITH\_TESTER.$$

Typically, the DIAG_SHIFT_TIME value is significantly smaller than the BIST_RUN_TIME value. As an example, DIAG_SHIFT_TIME may be approximately 40 µs, and BIST_RUN_TIME may be approximately 3000 µs. It is evident from the above equations that the test time can be drastically decreased by using embodiments described herein. Specifically, it can be seen from the equations that embodiments described herein can reduce the overall diagnostic time by 50%.

Embodiments described herein reduce the amount of time used for diagnostic data collection in multiple ways. First, the access speed to the embedded BIST engines for embedded memories is no longer restricted by JTAG clock speed generated by ATE, but can operate at much higher speeds on internally generated clocks (e.g., a clock signal generated internally in SoC 100) running at around 100-200 MHz, thus speeding up access to the BIST engine by a factor of 5 to 10.

Second, conventional ATE based diagnostic patterns that run on the ATE need to be deterministic, which means that, for each failure, prior to shifting out the diagnostic data, the BIST engine needs to advance through its full address step cycles to maintain the deterministic pattern (this corresponds to the "n×BIST_RUN_TIME" term in the equation for $T_{TRADITIONAL}$) However, embodiments described herein that use an OCMD do not have this requirement, and once a memory failure is detected, embodiments described herein may pause the BIST execution, immediately start the download of diagnostics data from the failing BIST engine, and immediately restart the next BIST execution loop to capture the diagnostic data of the next memory failure without waiting for the BIST engine to advance through its full test (this corresponds to the "n×BIST_RUN_TIME/2" term in the equation for $T_{OCMD}$, which assumes that the memory failures are uniformly distributed over the BIST).

Third, the diagnostics data upload to the ATE can be performed via DMA interface 138 instead of the slower serial JTAG test access port (TAP) 128. Moreover, the interaction with ATE only occurs after the diagnostic run completes or after the data container is full (as opposed to an interaction for each memory failure in traditional techniques).

Fourth, the number of test patterns can be reduced because the pass/fail test patterns can be combined with the diagnostic pattern. Moreover, the ATE pattern complexity and verification is reduced because OCMD 102 controls the BIST engines, which relieves the ATE from performing this task.

Figure 2:
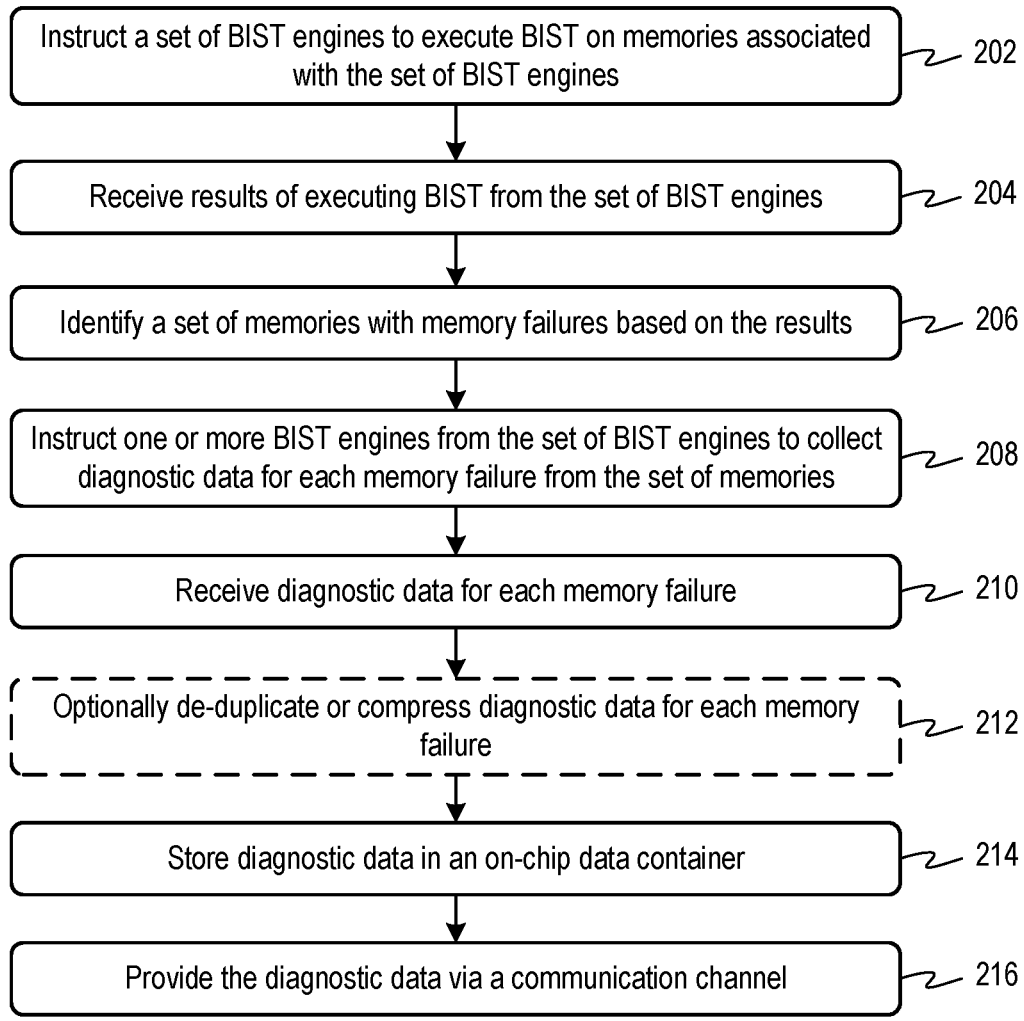
FIG. 2 illustrates a process for collecting diagnostics in accordance with some embodiments described herein.

FIG. 2 illustrates a process for collecting diagnostics in accordance with some embodiments described herein. In some embodiments, the process may be performed during volume manufacturing, and particularly during an HTOL test that is performed during volume manufacturing.

The process can begin by an OCMD circuit instructing a set of BIST engines to execute BIST on memories associated with the set of BIST engines (at 202). Next, the OCMD may receive results of executing BIST on the memories from the set of BIST engines (at 204).

The OCMD may then identify a set of memory failures in the memories based on the results (at 206). In some embodiments, the OCMD may identify up to an upper limit of memory failures. Specifically, the upper limit may be stored in a register, e.g., failure count register 120.

Next, the OCMD may instruct one or more BIST engines in the set of BIST engines to collect diagnostic data for each memory failure in the memories (at 208). The OCMD may then receive a set of diagnostic data for the set of memory failures (at 210). The diagnostic data may include, but is not limited to, a column address associated with the memory failure, a row address associated with the memory failure, and the state of the BIST engine and/or wrapper when the memory failure occurred.

Next, the OCMD may optionally de-duplicate or compress diagnostic data for each memory failure (at 212).

The OCMD may then store the set of diagnostic data in an on-chip data container (at 214). In some embodiments, the OCMD may truncate each diagnostic data in the set of diagnostic data in response to determining that the diagnostic data exceeds a size limit. Specifically, the size limit may be stored in a register, e.g., record size register 118.

Next, the OCMD may provide the set of diagnostic data via a communication channel (at 216). In some embodiments, the communication channel may be a DMA interface. In some embodiments, the communication channel may be a serial JTAG TAP. In some embodiments, the OCMD may be coupled with a tester via a set of signals (e.g., signals 136) and the communication channel (e.g., DMA interface or a serial JTAG TAP). The set of signals may include a data ready signal, and the tester may retrieve the diagnostic data stored in the on-chip data container via the communication channel when the OCMD asserts data ready signal.

Figure 3:
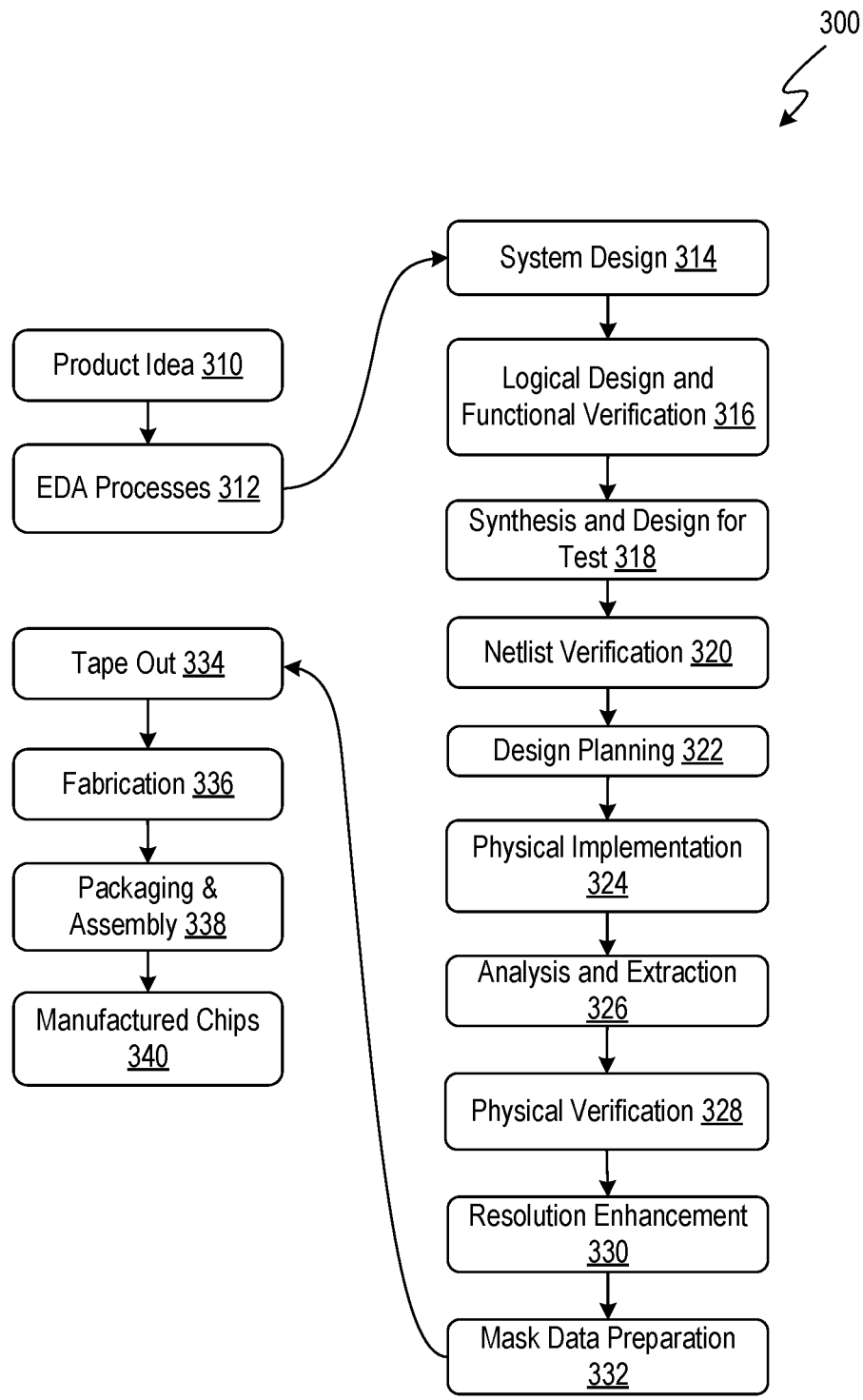
FIG. 3 illustrates an example flow for the design, verification, and fabrication of an integrated circuit in accordance with some embodiments described herein.

FIG. 3 illustrates an example flow 300 for the design, verification, and fabrication of an integrated circuit in accordance with some embodiments described herein. EDA processes 312 (the acronym "EDA" refers to "Electronic Design Automation") can be used to transform and verify design data and instructions that represent the integrated circuit. Each of these processes can be structured and enabled as multiple modules or operations.

Flow 300 can start with the creation of a product idea 310 with information supplied by a designer, information which is transformed and verified by using EDA processes 312. When the design is finalized, the design is taped-out 334, which is when artwork (e.g., geometric patterns) for the integrated circuit is sent to a fabrication facility to manufacture the mask set, which is then used to manufacture the integrated circuit. After tape-out, a semiconductor die is fabricated 336 and packaging and assembly 338 are performed to produce the manufactured IC chip 340.

Specifications for a circuit or electronic structure may range from low-level transistor material layouts to high-level description languages. A high-level of abstraction may be used to design circuits and systems, using a hardware description language ("HDL") such as VHDL, Verilog, SystemVerilog, SystemC, MyHDL or OpenVera. The HDL description can be transformed to a logic-level register transfer level ("RTL") description, a gate-level description, a layout-level description, or a mask-level description. Each lower abstraction level that is a less abstract description adds more detail into the design description. The lower levels of abstraction that are less abstract descriptions can be generated by a computer, derived from a design library, or created by another design automation process. An example of a specification language at a lower level of abstraction language for specifying more detailed descriptions is SPICE (which stands for "Simulation Program with Integrated Circuit Emphasis"). Descriptions at each level of abstraction contain details that are sufficient for use by the corresponding tools of that layer (e.g., a formal verification tool).

During system design 314, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 316, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as "emulators" or "prototyping systems" are used to speed up the functional verification.

During synthesis and design for test 318, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 320, the netlist is checked for compliance with timing constraints and for correspondence with the HDL code. During design planning 322, an overall floor plan for the integrated circuit is constructed and analyzed for timing and top-level routing.

During layout or physical implementation 324, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 326, the circuit function is verified at the layout level, which permits refinement of the layout design. During physical verification 328, the layout design is checked to ensure that manufacturing constraints are correct, such as DRC constraints, electrical constraints, lithographic constraints, and that circuitry function matches the HDL design specification. During resolution enhancement 330, the geometry of the layout is transformed to improve how the circuit design is manufactured.

During tape-out, data is created to be used (after lithographic enhancements are applied if appropriate) for production of lithography masks. During mask data preparation 332, the 'tape-out' data is used to produce lithography masks that are used to produce finished integrated circuits.

A storage subsystem of a computer system (such as computer system 400 of FIG. 4) may be used to store the programs and data structures that are used by some or all of the EDA products described herein, and products used for development of cells for the library and for physical and logical design that use the library.

Figure 4:
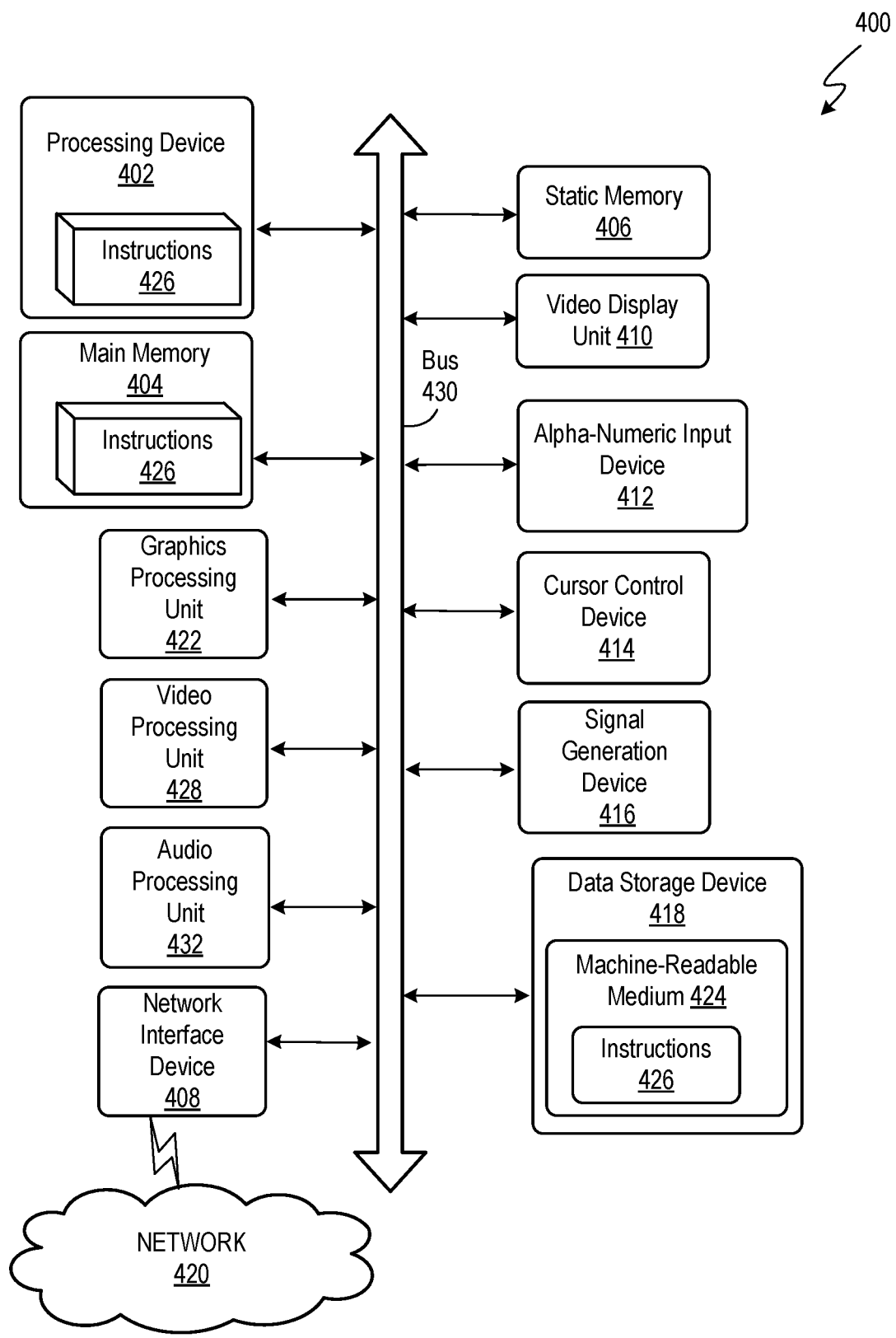
FIG. 4 illustrates an example machine of a computer system within which a set of instructions, for causing the machine to perform any one or more of the methodologies discussed herein, may be executed in accordance with some embodiments disclosed herein.

FIG. 4 illustrates an example machine of a computer system 400 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 400 includes a processing device 402, a main memory 404 (e.g., read-only memory (ROM), flash memory, dynamic random access memory (DRAM) such as synchronous DRAM (SDRAM), a static memory 406 (e.g., flash memory, static random access memory (SRAM), etc.), and a data storage device 418, which communicate with each other via a bus 430.

Processing device 402 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 402 may also be one or more special-purpose processing devices such as an application specific integrated circuit (ASIC), a field programmable gate array (FPGA), a digital signal processor (DSP), network processor, or the like. The processing device 402 may be configured to execute instructions 426 for performing the operations and steps described herein.

The computer system 400 may further include a network interface device 408 to communicate over the network 420. The computer system 400 also may include a video display unit 410 (e.g., a liquid crystal display (LCD) or a cathode ray tube (CRT)), an alphanumeric input device 412 (e.g., a keyboard), a cursor control device 414 (e.g., a mouse), a graphics processing unit 422, a signal generation device 416 (e.g., a speaker), graphics processing unit 422, video processing unit 428, and audio processing unit 432.

The data storage device 418 may include a machine-readable storage medium 424 (also known as a non-transitory computer-readable medium) on which is stored one or more sets of instructions 426 or software embodying any one or more of the methodologies or functions described herein. The instructions 426 may also reside, completely or at least partially, within the main memory 404 and/or within the processing device 402 during execution thereof by the computer system 400, the main memory 404 and the processing device 402 also constituting machine-readable storage media.

In some implementations, the instructions 426 include instructions to implement functionality corresponding to the present disclosure. While the machine-readable storage medium 424 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 402 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method, comprising:
   instructing, by an on-chip memory diagnostic circuit, a set of built-in self-test (BIST) engines to execute BIST on memories associated with the set of BIST engines;
   receiving results of executing BIST on the memories from the set of BIST engines, wherein the set of BIST engines execute BIST on the memories until BIST is complete;
   identifying a set of memory failures in the memories based on the results;
   instructing one or more BIST engines in the set of BIST engines to collect diagnostic data for each memory failure in the memories;
   receiving a set of diagnostic data for the set of memory failures;
   storing the set of diagnostic data in an on-chip data container; and
   providing the set of diagnostic data via a communication channel.

2. The method of claim 1, wherein the storing the set of diagnostic data in the on-chip data container comprises compressing the set of diagnostic data.

3. The method of claim 1, wherein the storing the set of diagnostic data in the on-chip data container comprises de-duplicating the set of diagnostic data.

4. The method of claim 1, wherein the storing the set of diagnostic data in the on-chip data container comprises truncating each diagnostic data in the set of diagnostic data in response to determining that the diagnostic data exceeds a size limit.

5. The method of claim 1, wherein the identifying the set of memory failures comprises identifying up to an upper limit of memory failures.

6. The method of claim 1, wherein the communication channel is a direct memory access (DMA) interface.

7. The method of claim 1, wherein the method is performed during a high temperature operating life (HTOL) test.

8. An integrated circuit (IC), comprising:
   a set of built-in self-test (BIST) engines to execute BIST on memories associated with the set of BIST engines; and
   an on-chip memory diagnostic (OCMD) circuit to:
      instruct the set of BIST engines to begin execution of BIST on memories associated with the set of BIST engines;
      receive results of executing BIST on the memories from the set of BIST engines;
      identify a set of memory failures in the memories based on the results;
      instruct one or more BIST engines in the set of BIST engines to collect diagnostic data for each memory failure in the memories, wherein the diagnostic data includes at least a column address and a row address associated with each memory failure;
      receive a set of diagnostic data for the set of memory failures;
      store the set of diagnostic data in a data container in the IC; and
      provide the set of diagnostic data via a communication channel.

9. The IC of claim 8, wherein the OCMD circuit compresses the set of diagnostic data.

10. The IC of claim 8, wherein the OCMD circuit de-duplicates the set of diagnostic data.

11. The IC of claim 8, wherein the OCMD circuit truncates each diagnostic data in the set of diagnostic data in response to determining that the diagnostic data exceeds a size limit.

12. The IC of claim 8, wherein the OCMD circuit identifies up to an upper limit of memory failures.

13. The IC of claim 8, wherein the communication channel is a direct memory access (DMA) interface.

14. The IC of claim 8, wherein the OCMD circuit asserts a data ready signal when the set of diagnostic data are ready to be retrieved from the on-chip data container.

15. An apparatus, comprising:
   a tester; and
   an integrated circuit (IC), comprising:
      a set of built-in self-test (BIST) engines to execute BIST on memories associated with the set of BIST engines; and
      an on-chip memory diagnostic (OCMD) circuit to:
         instruct the set of BIST engines to begin execution of BIST on memories associated with the set of BIST engines;
         receive results of executing BIST on the memories from the set of BIST engines;

identify a set of memory failures in the memories based on the results;

instruct one or more BIST engines in the set of BIST engines to collect diagnostic data for each memory failure in the memories, wherein the diagnostic data includes at least a column address and a row address associated with each memory failure;

receive a set of diagnostic data for the set of memory failures;

store the set of diagnostic data in a data container in the IC; and provide the set of diagnostic data to the tester via a communication channel.

16. The apparatus of claim 15, wherein the OCMD circuit compresses the set of diagnostic data.

17. The apparatus of claim 15, wherein the OCMD circuit de-duplicates the set of diagnostic data.

18. The apparatus of claim 15, wherein the OCMD circuit truncates each diagnostic data in the set of diagnostic data in response to determining that the diagnostic data exceeds a size limit.

19. The apparatus of claim 15, wherein the OCMD circuit identifies up to an upper limit of memory failures.

20. The apparatus of claim 15, wherein the communication channel is a direct memory access (DMA) interface, and wherein the tester retrieves data stored in the on-chip data container via the DMA interface in response to the OCMD circuit asserting a data ready signal.

* * * * *